United States Patent
Hsu et al.

(10) Patent No.: US 7,378,853 B2
(45) Date of Patent: May 27, 2008

(54) SYSTEM AND METHOD FOR DETECTING CABLE FAULTS FOR HIGH-SPEED TRANSMISSION LINK

(75) Inventors: Louis L. Hsu, Fishkill, NY (US); Harry I. Linzer, Raleigh, NC (US); James Rockrohr, Hopewell Junction, NY (US); Huihao H. Xu, Brooklyn, NY (US)

(73) Assignee: International Business Machines Corporation, Armonk, NY (US)

( * ) Notice: Subject to any disclaimer, the term of this patent is extended or adjusted under 35 U.S.C. 154(b) by 724 days.

(21) Appl. No.: 10/708,384

(22) Filed: Feb. 27, 2004

(65) Prior Publication Data

US 2005/0190828 A1  Sep. 1, 2005

(51) Int. Cl.
*G01R 31/02* (2006.01)
(52) U.S. Cl. ................................................ 324/543
(58) Field of Classification Search ................ 324/543
See application file for complete search history.

(56) References Cited

U.S. PATENT DOCUMENTS

| 5,142,526 | A  | * | 8/1992  | Moriue et al. ............. 370/245 |
| 6,129,569 | A  |   | 10/2000 | Fernandez |
| 6,181,454 | B1 | * | 1/2001  | Nagahori et al. ........... 398/210 |
| 6,505,317 | B1 |   | 1/2003  | Smith et al. |
| 6,597,224 | B2 | * | 7/2003  | Lin et al. .................... 327/205 |
| 2005/0094737 | A1 | * | 5/2005 | Vorenkamp ................. 375/257 |

OTHER PUBLICATIONS

IEEE Computer Society, IEEE Standard for Boundary-Scan Testing of Advanced Digital Networks, Apr. 17, 2003, The Institute of Electrical and Electronics Engineers, Inc., IEEE Std 1149.6-2003, pp. 24-30.*

* cited by examiner

*Primary Examiner*—Andrew H. Hirshfeld
*Assistant Examiner*—Timothy J Dole
(74) *Attorney, Agent, or Firm*—Joseph P. Abate; Daryl Neff

(57) ABSTRACT

A system and method of detecting a fault in a transmission link are provided which includes providing a selectable reference level according to one of a direct current (DC) mode threshold and an alternating current (AC) mode threshold, wherein the DC mode threshold is a fixed potential and the AC mode threshold varies with time. An input signal arriving from the transmission link is compared to one of the DC mode threshold and the AC mode threshold to determine whether a fault is present in the transmission link.

25 Claims, 16 Drawing Sheets

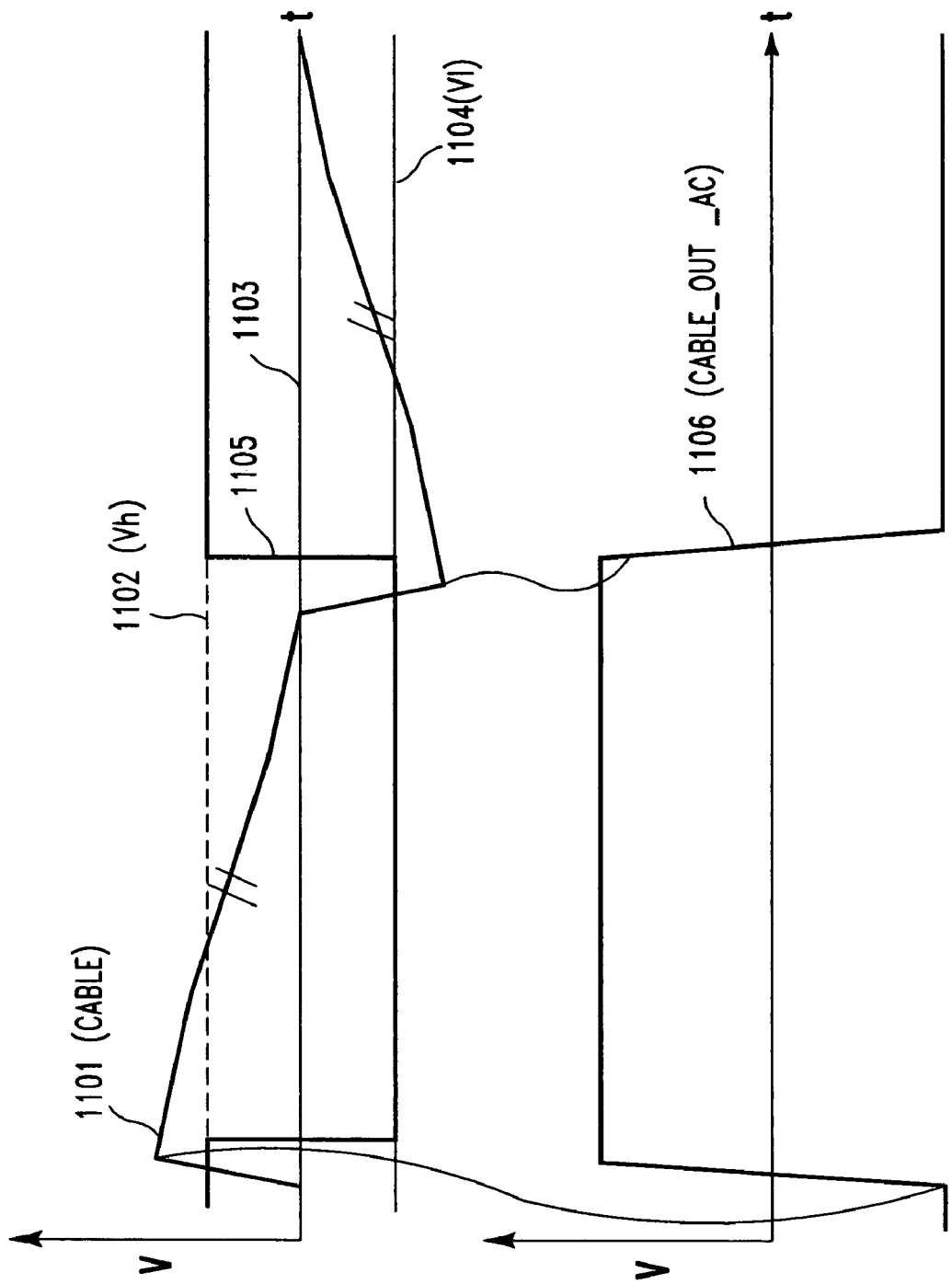

SYSTEM AND METHOD FOR DETECTING CABLE FAULTS FOR HIGH-SPEED TRANSMISSION LINK

BACKGROUND OF INVENTION

The present invention relates to the determination of connectivity faults in communication systems, especially between chips at opposite ends of a transmission link.

Connectivity faults are of several types including "stuck-at" faults in which a transmitted signal appears stuck at either a low state or a high state and fails to transition between states. Other types of connectivity faults include those in which a coupling capacitor used for alternating current (AC) mode operation is shorted, and those in which the arriving signal appears to "float", such as when the cable is disconnected from the signal source. Elements which provide connectivity between chips at remote and near ends of a transmission link include at least a transmitter of the chip at the remote end, the package of the chip at the remote end, a card connecting the remote end chip to the chip at the near end, an AC coupling capacitor, the package of the near-end chip, and a receiver implemented on the near-end chip. Connectivity between chips of such system is frequently referred to as "cable connectivity", whether or not a literal cable (rather than a card or other conductive connection) is provided between the packages of respective chips. One way to test the cable connectivity is to send a stream of test data from a remote transmitter and then verify the data received at the near-end receiver.

In AC coupled transmission links, termination is provided at the source (transmitter side) such that no DC current is sunk at the receiver end. In such AC coupling mode, a high-pass filter exists by the combination of the series AC coupling capacitor (also referred to as a "DC blocking capacitor") and a termination resistor which is shunted to ground. The high-pass filter causes low-frequency test signals to decay with an "RC" time constant determined by the magnitude of the resistance (R) and the capacitance (C) of the respective circuit elements, which can be fixed or variable.

Differential signal transmission is frequently favored for the transmission of higher frequency RF signals over signal conductors. An advantage of differential signal transmission is larger peak-to-peak differential signal swing and improved common mode noise rejection. However, differential signal transmission poses particular challenges. Heretofore, robust systems have not been provided for detecting and isolating a single-ended connectivity failure of a differential signal transmission link. For differential signal transmission links, it is not sufficient to detect the presence and/or absence of signals on a pair of signal conductors, a robust cable fault detector must determine which of two cables carrying the paired differential signals is faulty. The challenges of testing are particularly great when detecting a failing signal conductor when communication between chips is provided in an AC coupling mode in which signals must pass through an AC coupling capacitor, because such capacitor blocks direct current (DC) transmission. While some techniques such as AGC (adjusted gain control), DFE (decision feed-back equalization), etc., are available to reconstruct received signals, such techniques are of no use when signals are suddenly ruined by signal interference, or accidental disconnection of a cable from one or two ends of the transmission link.

Conventional signal detectors operate by detecting the absence of a valid signal within a specified latency. However, a signal detector cannot determine whether the failure is due to the cable, or the data itself. Neither can it tell which cable has a problem, or what type of defect mechanism is present, i.e., whether the fault is one of stuck-at high, stuck-at low or floating. This is because such signal detectors detect the presence of absence of signal from the difference between levels of a pair of differential signals arriving from the transmission link.

It would be desirable, as has been mandated by the 1149.6 standard of the Institute of Electrical and Electronics Engineers (IEEE) entitled "IEEE Standard for Boundary-Scan Testing of Advanced Digital Networks", published April, 2003 (hereinafter IEEE 1149.6), to provide a cable fault detector at a receiver end of a transmission link, which detects single-ended cable faults for both AC and DC coupling modes.

In addition, it is often desirable to discharge conductors of coaxial cables prior to inserting them into a coaxial connector. Semiconductor devices on an integrated circuit chip are susceptible to damage from electrostatic discharge (ESD). As device sizes are progressively shrunk, proper ESD protection is increasingly necessary to avoid catastrophic failure, or degradation in reliability. Cable ESD has become a serious issue. To avoid such damage, a user can manually discharge a cable by grounding it to the instrument chassis before fastening it to the connector while the IC is powered off. U.S. Pat. No. 6,129,569 issued Oct. 10, 2000 to Fernandez, entitled "Electrostatic Discharge Protection Device for Coaxial Systems" describes a cable discharge device which mounts to a coaxial connector. Its mechanical structure allows the cable to be momentarily grounded while the cable is advanced toward the connector. However, once the cable is inserted into the connector, it cannot be discharged again. Such device does not allow the cable to be discharged after plugging it into the chassis. ESD related damage can result if static charge builds up after the cable is connected.

Accordingly, it would be desirable to provide a cable discharge switch to discharge the cable even after the cable is inserted, such that the cable can be discharged whenever the system is powered down.

IEEE 1149.6 describes rules and testing instructions for testing single-ended cable faults for both AC and DC coupling modes. This publication is not admitted to be prior art. This publication proposes some implementations of a cable fault detector, but they are bulky and some of them are not practical. It is desirable that a cable fault detector not be bulky that it only minimally loads the incoming signal path. Otherwise, jitter increases at the receiver coupled to the incoming signal path.

As a first cable fault detector proposed by IEEE 1149.6, a hysteresis comparator 10 is used for comparing a signal from a single-ended cable to a delayed version of the same signal, as illustrated in FIG. 1. Such cable fault detector has two problems. First, a delay element 12 having a fairly long delay is needed in order to carry out the comparison. Such delay element will be bulky, requiring a large area of the chip. Second, the comparison destroys the hysteresis effect. For AC coupled signal having an RC decay, as described above, when the decay drops to a certain level, the output of the hysteresis comparator 10 changes state. As a result, such cable fault detector, while capable of detecting a shorted AC coupling capacitor, is poorly suited for testing an AC coupled mode, because it does not maintain state when the AC signal decays.

Another cable fault detector 20 proposed by IEEE 1149.6 is shown in FIG. 2. Such cable fault detector is provided for detecting faults in each of a pair of single-ended cables carrying differential signals. Each hysteresis comparator 34, 36 is provided as a combination of two regular comparators 38 and a flip-flop 39 capable of being set and reset asynchronously by the outputs of the comparators and being initialized by an Init Data input on a clock edge provided by Init Clk. The signal from each single-ended cable 24 or 26 is compared to a self-referenced, i.e., low-pass filtered version of the same signal. The advantage of this approach is that no additional reference level is needed. But, considerably high resistance ("R" equal to about 3 kΩ) and capacitance ("C" equal to about 1 pF) are necessary to implement the cable fault detector, requiring large silicon area. Compared to the first cable fault detector (FIG. 1) proposed by IEEE 1149.6, the second cable fault detector is more suitable for testing faults in AC coupled mode, since it latches the state after detecting a signal edge. The RC decay of the signal does not cause the state to change, since it does not rely upon detecting the signal edge. Such cable fault detector also filters out high-frequency noise. However, the resulting test receiver is bulky, and is incapable of testing in DC coupling mode.

A further proposed arrangement for cable DC test is provided by IEEE 1149.6, as illustrated in FIGS. 3A and 3B. In that proposal, a pair of two comparators 138 are provided, both of which are connected to one of two cables which together carry a differential signal pair, of which only one incoming signal A is shown. That proposal is similar to that shown in FIG. 2 except that each comparator compares the signal from a respective cable to a fixed reference level $V_{BIAS}$, rather than a self-generated reference. The reference level can be the DC common level which is available at the receiver end.

A cable having a defective (short-circuited) AC coupling capacitor is detected by such DC test arrangement as follows. The near end (receiving end) of the cable is initially reset (e.g. discharged to ground) and then permitted to float. At the same time, the output C of the flip-flop 139 is initialized to low by Init Clk, as shown at the EXTEST Capture Window in FIG. 3B. After being reset, a cable having a good capacitor stays at the reset state such that the output of the flip-flop 139 stays low. However, the signal potential A on a cable having a defective, short-circuited capacitor reverts to a nonzero DC voltage. When the nonzero voltage at A crosses the threshold provided by the $V_{BIAS}$ reference level, the signal, it is latched by flip-flop 139 as a digital indicator of the short circuit. In such manner, capacitor short circuits are identified.

Without using the data reset scheme, it is not possible for the cable fault detector to detect short-circuited capacitors using DC test mode. Disadvantages of this scheme include the need to have a large RC component to generate self-reference, and the need to have a reset feature to reset the internal node of the hysteresis buffer latch. In addition, the proposed arrangement does not describe the provision of separate threshold levels for input to the comparator for DC mode and AC mode tests. Since signal levels are quite different for DC mode and AC mode tests, threshold levels should be set differently in order to reduce the effect of noise on comparator operation.

SUMMARY OF INVENTION

According to an aspect of the invention, a system is provided for detecting a fault in a transmission link. Such system includes a reference level generator operable to output a selectable reference level according to one of a direct current (DC) mode threshold and an alternating current (AC) mode threshold, wherein the DC mode threshold is a fixed potential and the AC mode threshold varies with time. Such system further includes a comparator operable to detect the crossing of the reference level by an input signal arriving from the transmission link.

According to another aspect of the invention, a method of detecting a fault in a transmission link is provided. Such method includes providing a selectable reference level according to one of a direct current (DC) mode threshold and an alternating current (AC) mode threshold, wherein the DC mode threshold is a fixed potential and the AC mode threshold varies with time. An input signal arriving from the transmission link is compared to one of the DC mode threshold and the AC mode threshold to determine whether a fault is present in the transmission link.

BRIEF DESCRIPTION OF DRAWINGS

FIGS. 14A-14B illustrate the operation of the cable fault detector shown in FIG. 11 in AC mode testing of AC coupled transmission links.

DETAILED DESCRIPTION

Among the goals of embodiments of the invention described herein are to provide a simpler and smaller cable circuit which fulfills connectivity test requirements called for by IEEE 1149.6. A goal of the embodiments provided herein is to provide a simple unified cable fault detector capable of performing both AC and DC coupling mode tests for verifying cable connectivity. Fault types including stuck-at faults, floating faults, and short-circuited capacitor faults are identifiable by embodiments of the cable fault detectors described herein.

In addition, an improved hysteresis comparator is provided which permits the degree of hysteresis to be tuned as needed to satisfy the different needs of testing in AC coupling and DC coupling modes. Also, in a particular embodiment of the invention, a high threshold voltage p-type field effect transistor (PFET) is utilized as a resistive device for low-pass filtering, reducing the chip area required to implement a corresponding RC filter.

Figure 1:
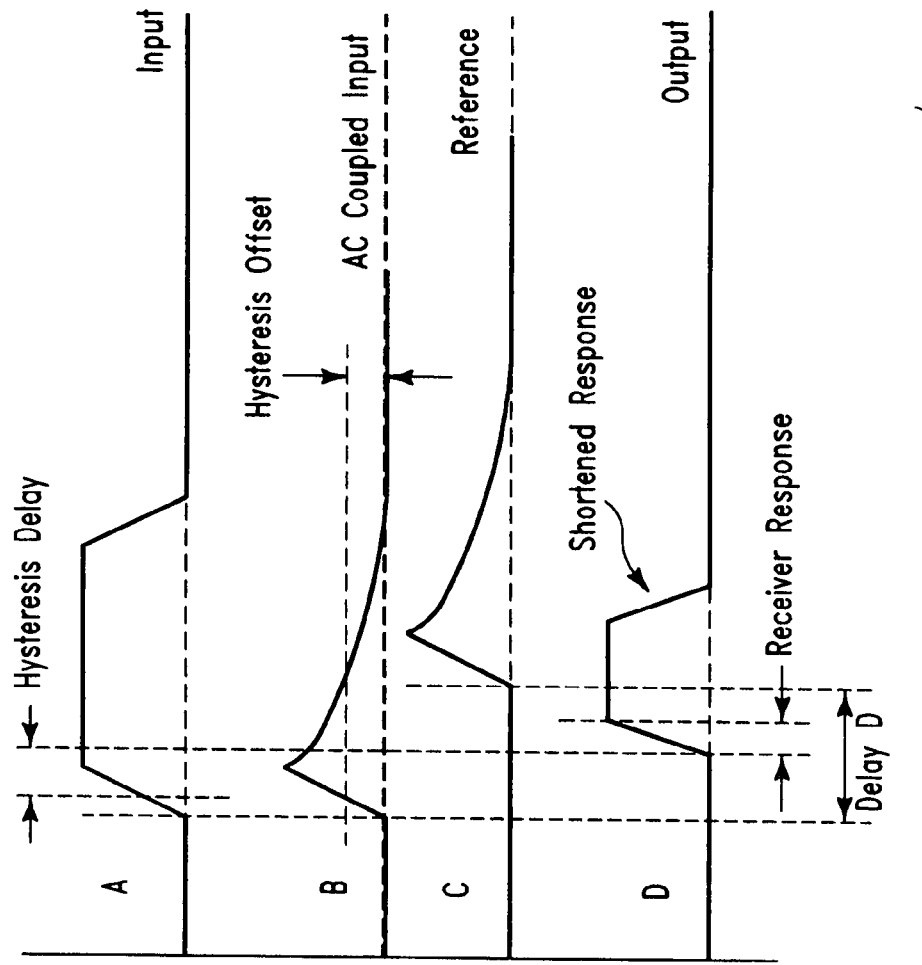
FIGS. 1 through 3B illustrate proposed arrangements for detecting cable faults according to IEEE 1149.6, which is not admitted to be prior art.
Figure 1:
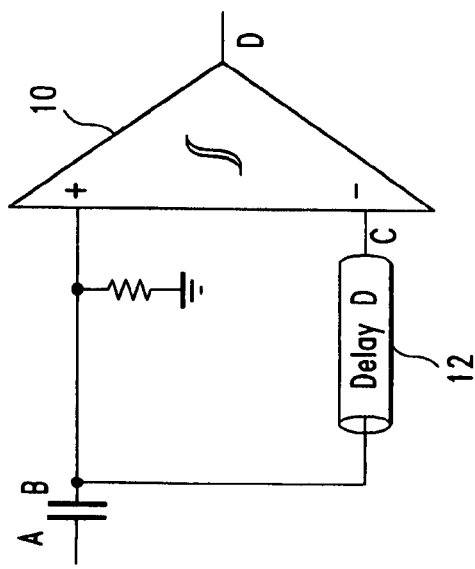
Figure 2:
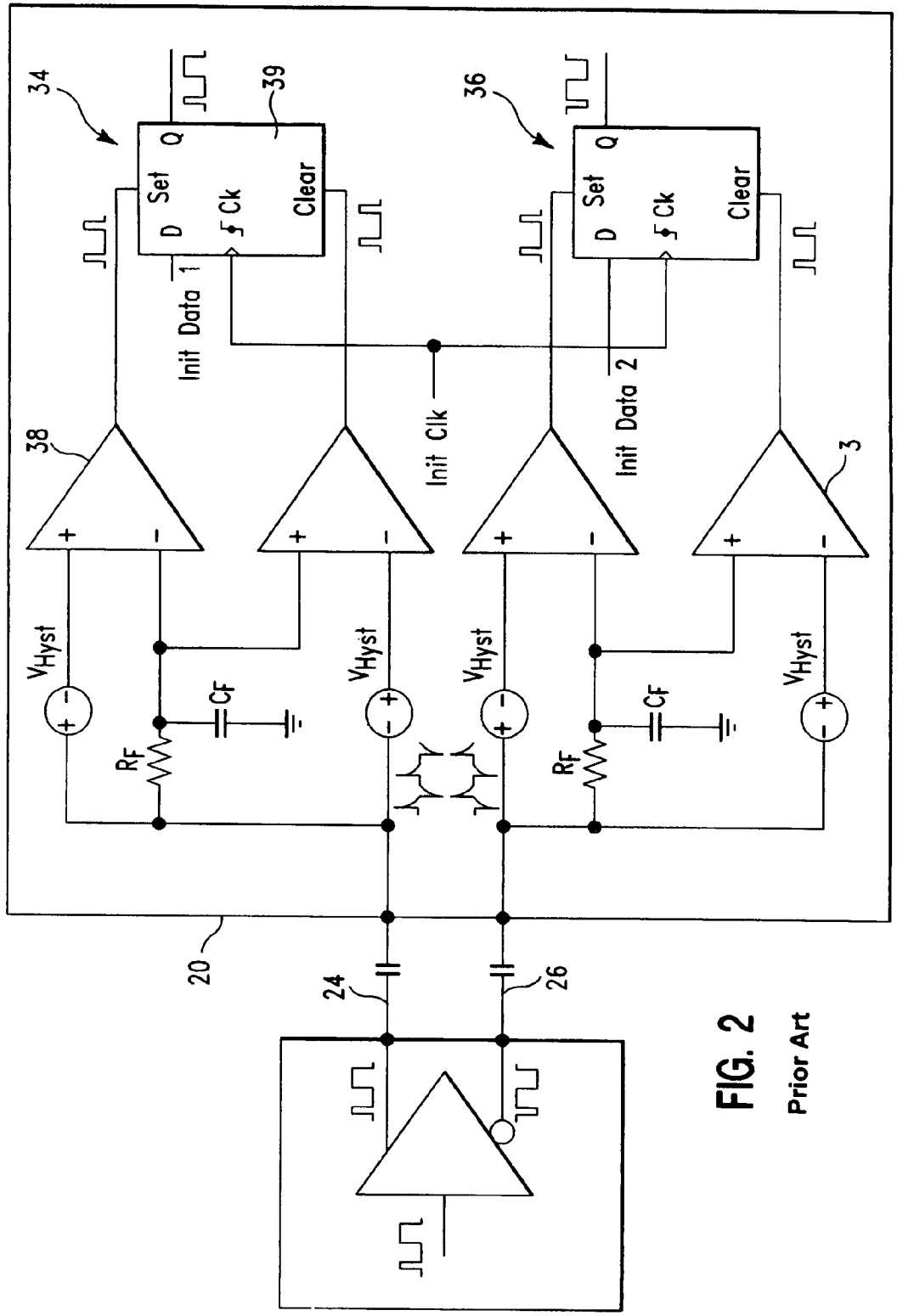
Figure 3A:
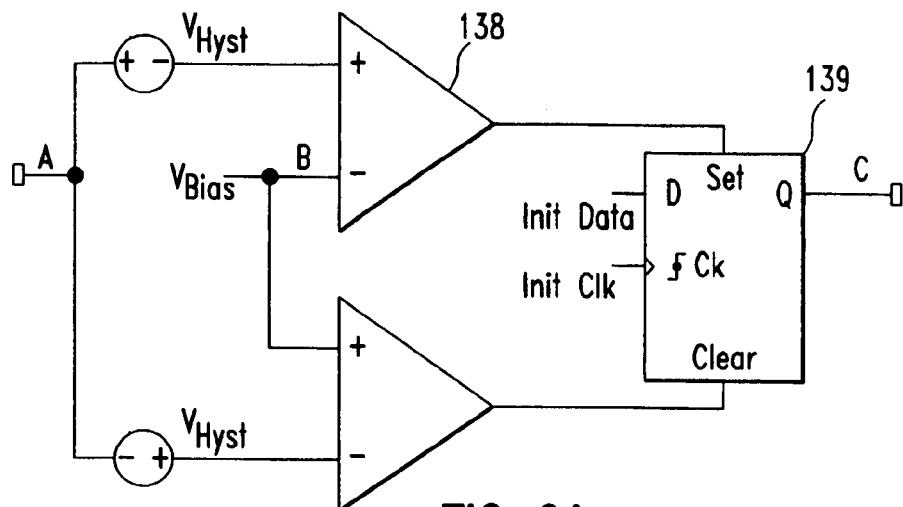
Figure 3B:
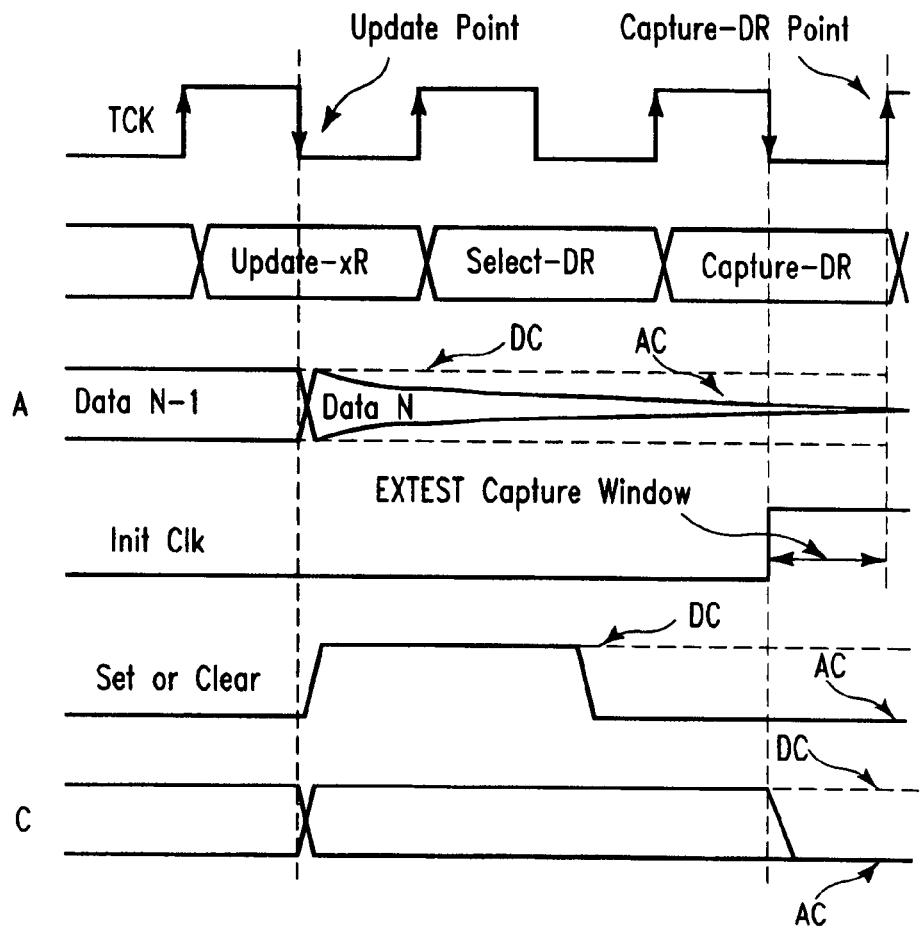
Figure 4:
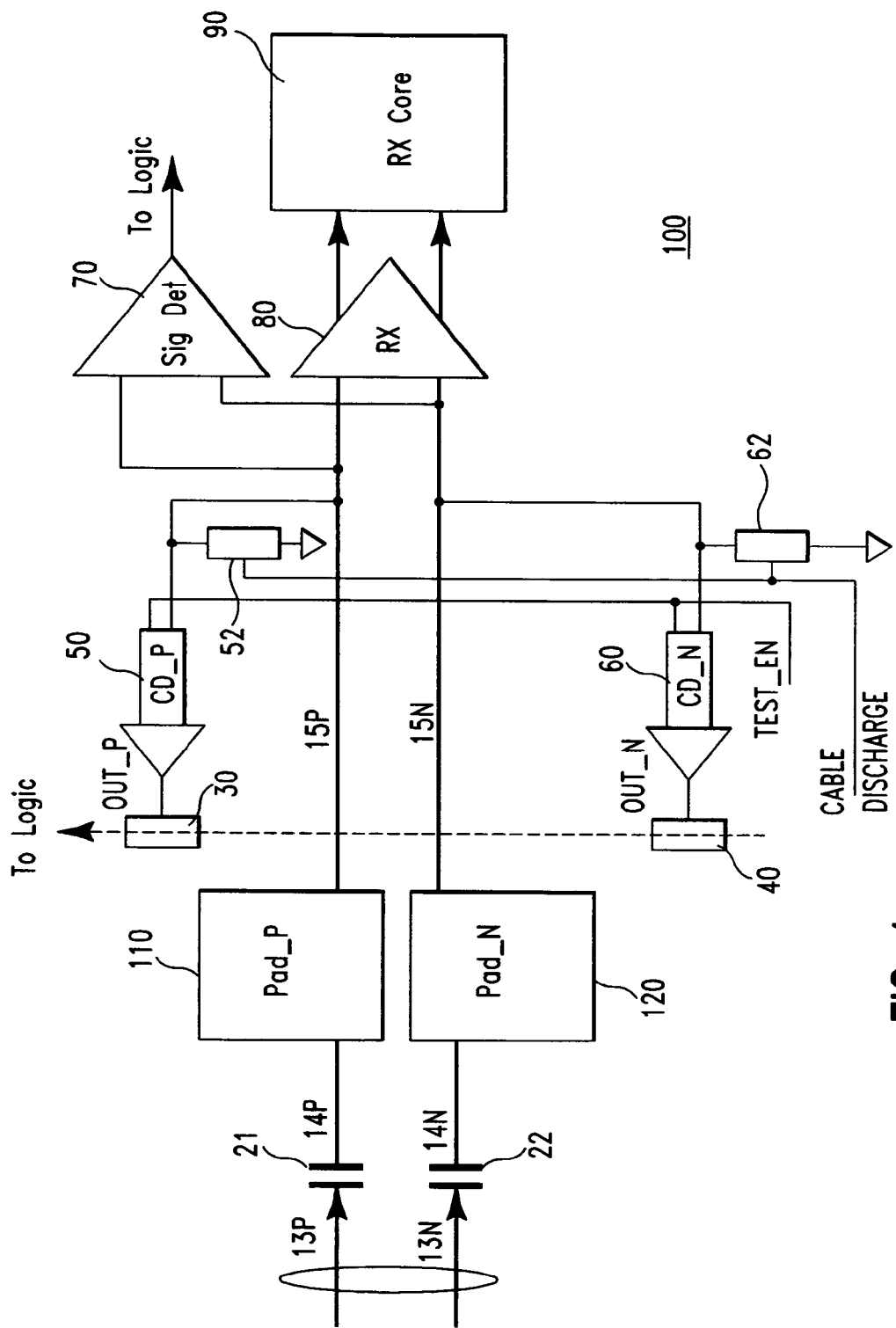
FIG. 4 is a block and schematic diagram illustrating the interconnection of a pair of cable fault detectors in a chip according to an embodiment of the invention.

FIG. 4 is a block and schematic diagram illustrating the interconnection of a pair of cable fault detectors 50, 60 in a chip 100 according to an embodiment of the invention. As shown therein, signals arrive from a transmission link on a pair of cables 13P and 13N carrying differential signals, and are coupled by coupling capacitors 21, 22, respectively, to signal conductors 14P and 14N, which, in turn are coupled to the pads 110, 120 of the chip 100. In turn, the pads 10, 20 are coupled to a pair of internal differential signal conductors 15P and 15N, respectively. The internal differential signal conductors 15P, 15N are coupled as input to a signal detector 70 and a receiver 80. In turn, receiver 80 is connected to a receiver (RX) core 90 for outputting a latched data signal thereto.

As shown in FIG. 4, a first cable fault detector 50 is coupled to receive input from the first internal differential signal conductor 15P and a second cable fault detector 60 is coupled to receive input from the second internal differential signal conductor 15N. Each of the cable fault detectors 50, 60, when enabled by a TEST_EN input, outputs a detection signal which is latched by a respective scan latch 30, 40. Cable discharge devices 52, 62 are provided to controllably reset voltages on internal differential signal conductors 15P, 15N in accordance with a Cable Discharge signal, as appropriate before or during testing. Devices 52, 62 can also be used for ESD protection, as well, such as when connecting a cable to the chip 100. When the Cable Discharge signal is active, the voltages on the signal conductors 15P, 15N are discharged to ground. After the cable is connected to the chip 100, the Cable Discharge signal is deactivated, which then allows signals on conductors 15P and 15N to be input normally to the cable fault detector again. During testing of the cables, signal detector 70, the receiver 80, and other receiver components are turned off to reduce noise on signal conductors 15P and 15N, because single-ended cable fault detectors are more susceptible to noise.

Figure 5A:
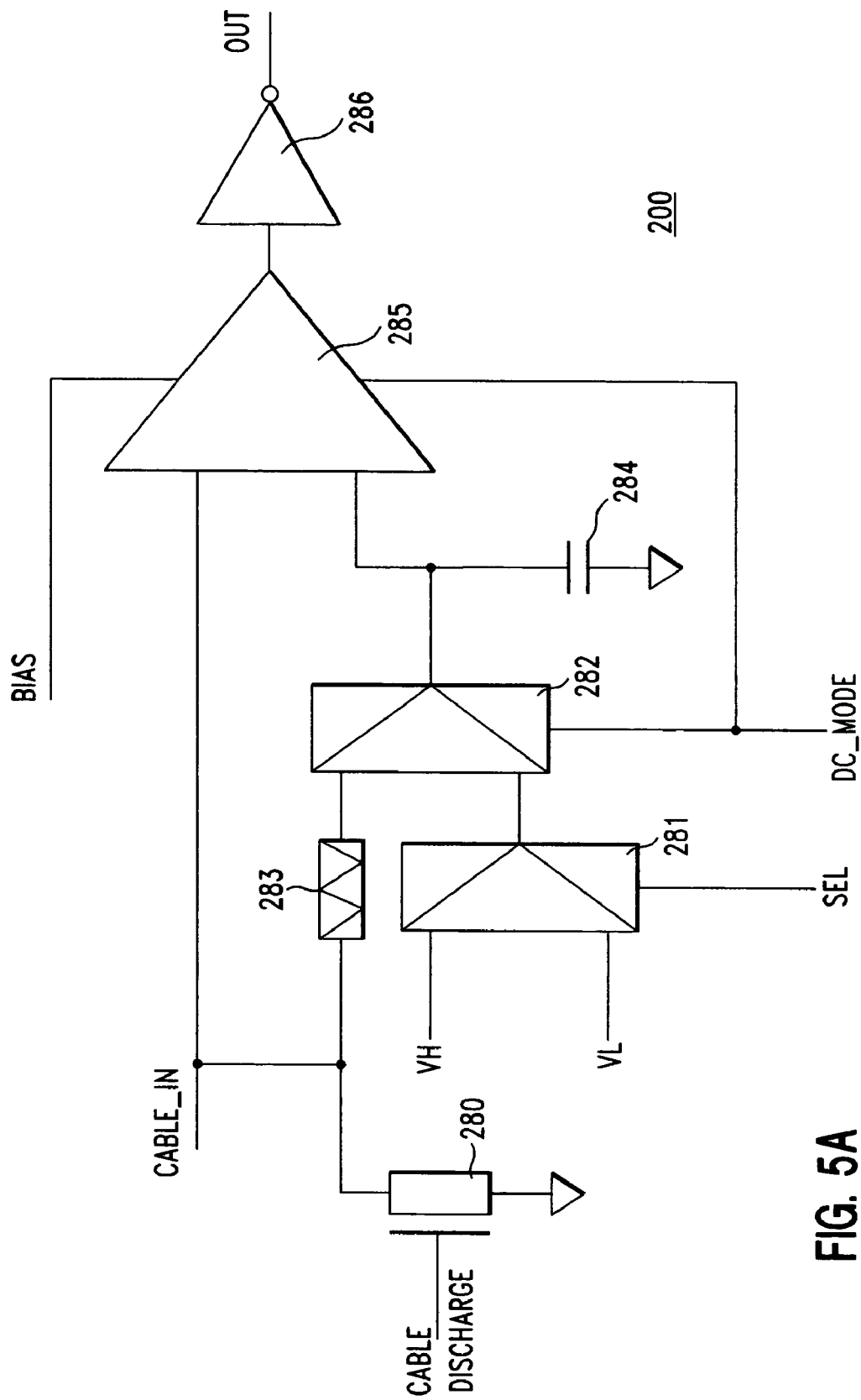
FIG. 5A schematically illustrates a cable fault detector according to an embodiment of the invention.

A first embodiment of a cable fault detector 200 is illustrated schematically in FIG. 5A. As illustrated, the cable fault detector 200 includes a discharge device 280, a resistive element 283, a capacitive element 284, two multiplexers 281 and 282, an adjustable hysteresis comparator 285, and an output inverter 286. The discharge device 280 is the same as the discharge device 52 shown and described above with respect to FIG. 4. During AC mode testing, the resistive element 283 and capacitive element 284 form a low-pass filter. The incoming signal "CABLE_IN" is provided as a first input of the hysteresis comparator 285. During AC mode testing, a low-pass filtered version of the incoming signal is provided as a second input. The DC_MODE control signal, when low, controls when the low-pass filtered version is connected via the second multiplexer 282 to the comparator 285 as a self-reference signal. The DC_MODE control signal also controls the hysteresis level setting of the comparator. During DC test mode, comparator 285 operates with little or no hysteresis, i.e., as a "pure" comparator. During such test mode, one of a fixed upper reference level "VH" and a lower fixed reference level "VL" is applied to comparator 285 via the first multiplexer 281, in accordance with a select signal "SEL" provided thereto. The signal SEL is typically driven by a control block (not shown) external to the cable fault detector 200, such as according to a programmed test routine.

Figure 5B:
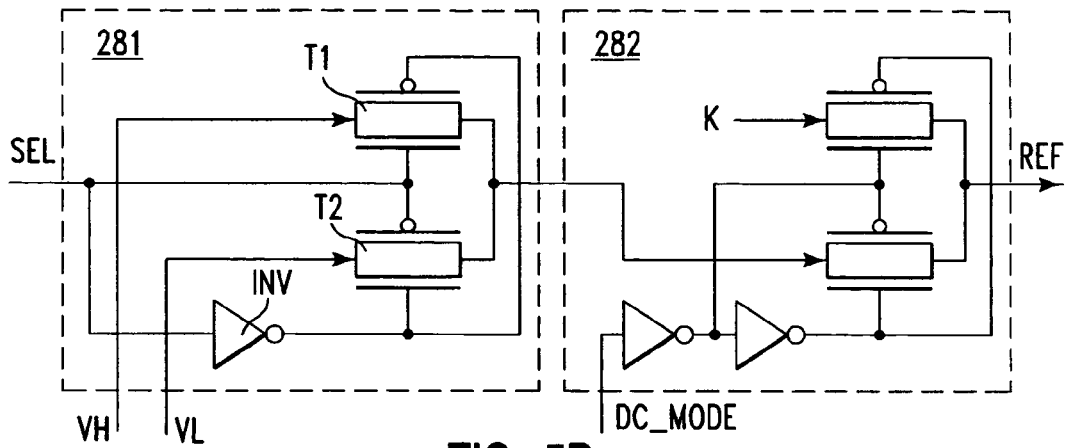
FIG. 5B illustrates multiplexer circuits utilized in the cable fault detector shown in FIG. 5A.

FIG. 5B is a circuit diagram of the two multiplexers 281 and 282 utilized in the cable fault detector 200. A first control signal "SEL" is used to select either the high ("VH") or low ("VL") threshold level. A second control signal "DC_MODE" is used to select whether the self-reference signal denoted by "K" here, or the external reference (VH or VL) is output from the second multiplexer 282.

Figure 6:
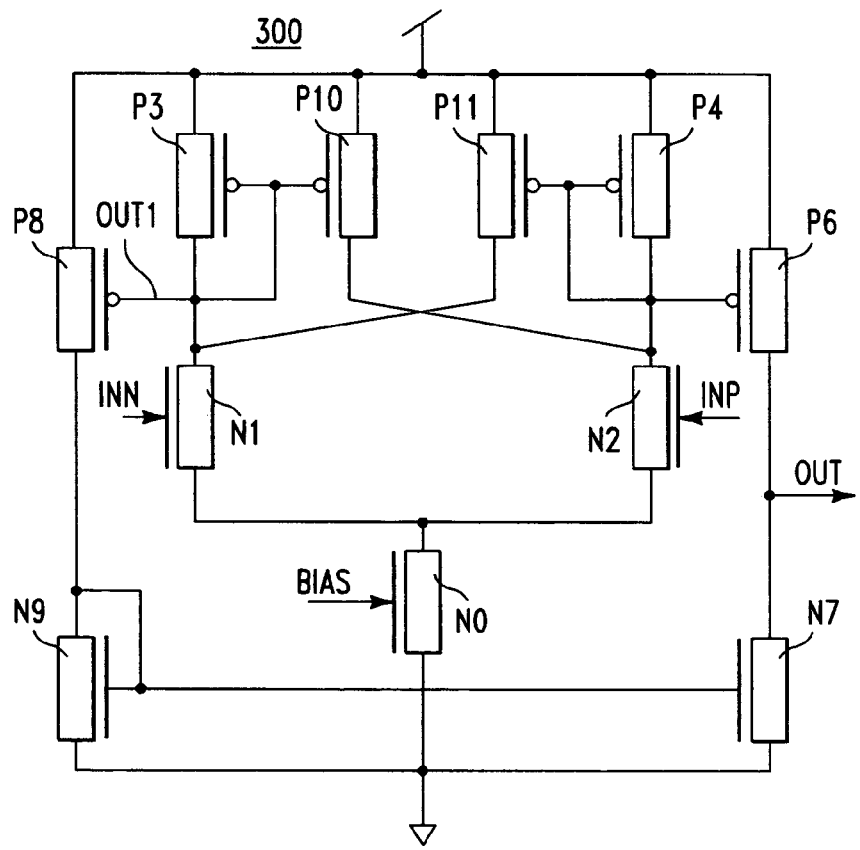
FIG. 6 is a circuit diagram illustrating a hysteresis comparator according to the prior art.

The hysteresis comparator 285 of the cable fault detector 200 will now be discussed. The concept of a hysteresis comparator is known and well documented. FIG. 6 is a circuit-level schematic of a hysteresis comparator 300 described in the textbook authored by Phillip E. Allen and Douglas R. Holberg, entitled CMOS Analog Circuit Design, Oxford University Press, 2002, pp. 466 475. The comparator 300 has an output stage amplifier formed by the PFET devices P8, P6, and the NFET devices N9 and N7. By keeping the transconductance (gm) ratio of P10 to P3 and of P11 to P4 greater than unity, fixed built-in positive and negative hysteresis threshold levels are provided. The comparator has a differential input stage formed by the PFET devices P3, P10, P11, P4, and the NFET devices N1, N2 and N0. Two feedback paths are provided by this circuit. A current series feedback path is provided through the common source node of transistors N1 and N2, which is a negative feedback path. Voltage shunt feedback paths are provided through the gate to drain connections of P10 and P11, which are positive feedback paths. So long as the positive feedback factor is greater than the negative feedback factor, the overall feedback is positive, and the transfer curve will exhibit hysteresis, i.e., the input signal voltage at which the comparator switches between output states varies depending upon the direction of movement of the signal voltage. By controlling the transconductance ratio of the pair of devices P10 to P3 (and also the pair of devices P11 to P4) one can adjust the hysteresis level, provided that the transconductance ratio is higher than one. If the transconductance of each such pair of devices is identical, or the ratio is less than one, then no hysteresis results, such that the circuit behaves like a pure comparator.

In the embodiments of the invention described herein, a hysteresis comparator is provided in which the hysteresis level is adjustable, such that the comparator can be used for both AC mode and DC mode testing. When testing AC coupled signals (i.e., those for which an AC coupling capacitor is provided in the transmission link), the input signal arriving from the transmission link decays with time, as discussed above. Accordingly, the comparator requires more built-in hysteresis in order to maintain the output state of the comparator despite the decay in the input signal. On the other hand, for DC mode testing, less built-in hysteresis is allowed. A fixed high reference level is used to detect the positive swing signal and a fixed low reference level is used to detect the negative swing signal.

Such DC mode testing is used to determine when an AC coupling capacitor of an AC coupled signal cable is short-circuited. When a cable is good, having no short-circuited capacitor, the comparator output signal will have a shorter duration than when the capacitor is short-circuited, due to the RC decay of the input signal. To detect short-circuited capacitors using DC mode testing, the values latched in the shift registers 30 and 40 (FIG. 4) coupled to the outputs of the comparators are sampled at a point in time of at least one RC time constant following the transition of the input signal.

Figure 7:
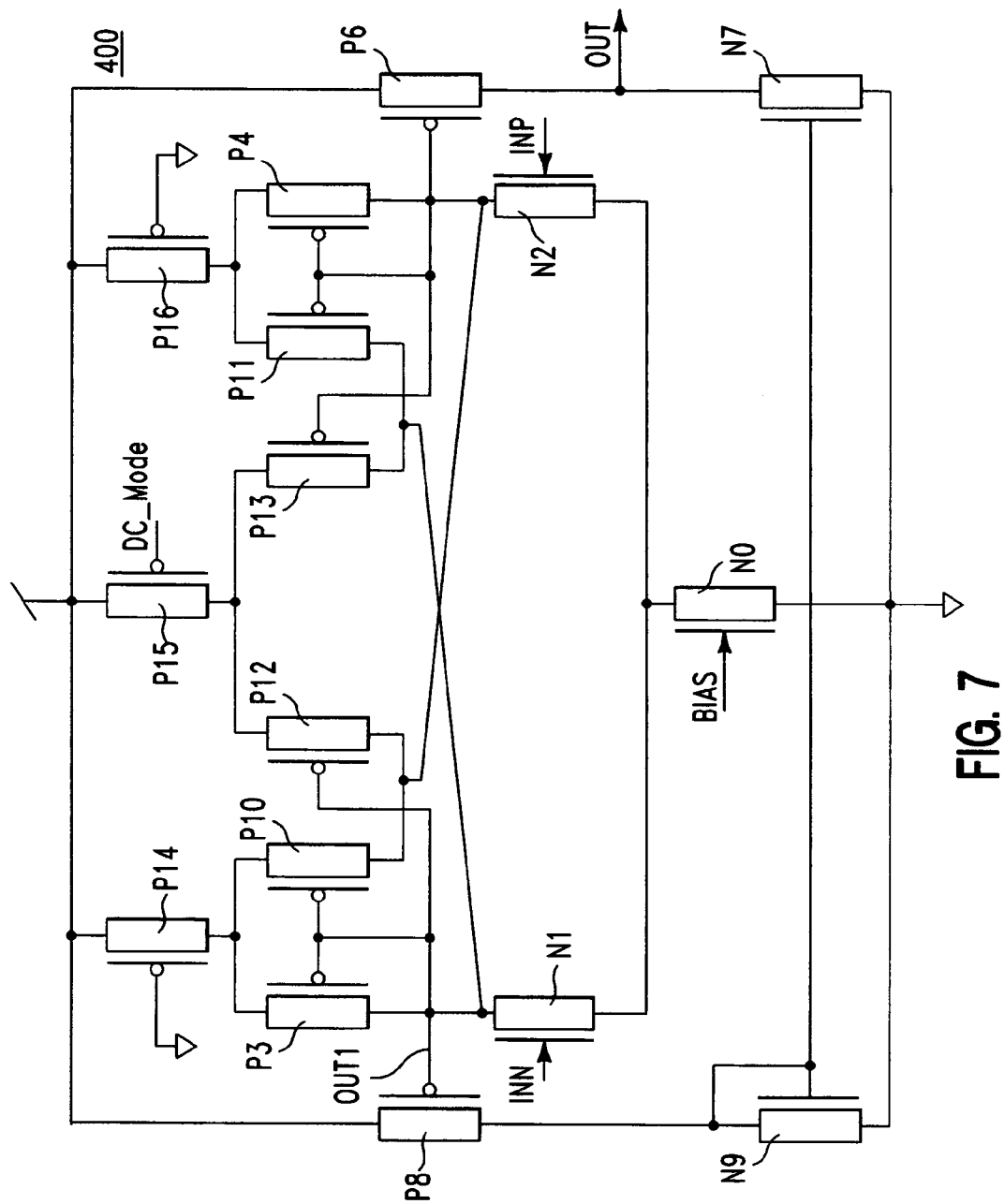
FIG. 7 is a circuit diagram illustrating a hysteresis comparator according to an embodiment of the invention.

FIG. 7 illustrates a circuit-level schematic of the hysteresis comparator 285 having an adjustable hysteresis level for use in the cable fault detector 200 (FIG. 5) according to an embodiment of the invention. Such comparator includes additional shunt devices P12 and P13. The comparator operates by selectively shunting the P10 and P11 devices by devices P12 and P13 so that the transconductance ratios with respect to device P3 and device P4, respectively, change from near unity for DC mode testing to ratios greater than one for AC mode testing. In this example, device P12 shunts device P10 during AC mode testing, and device P13 shunts device P11 during AC mode testing. At such time, the transconductance ratio of devices P10 and P12 to device P3 is greater than one, thereby producing a desired hysteresis. At the same time, the transconductance ratio of devices P11 and P13 to device P4 is greater than one, producing the desired hysteresis. On the other hand, when DC mode testing is performed, the DC_Mode input turns off the shunt devices, thereby lowering the transconductance ratios again, and turning off the hysteresis function of the comparator.

In a particular embodiment, the DC_Mode input to the gate of PFET P15 is provided as a variable analog input, converted from a multi-bit digital representation thereof, so as to turn on device P15 to a greater or lesser degree, depending upon the value of the digital representation. In such manner, the degree of hysteresis can be tailored to the particular use to which the chip is put, by changing the value of the digital representation that is converted to an analog signal and provided to the gate of device P15. A larger digital representation leads to a greater degree of hysteresis. Conversely, a smaller digital representation leads to a lower degree of hysteresis.

Figure 8A:
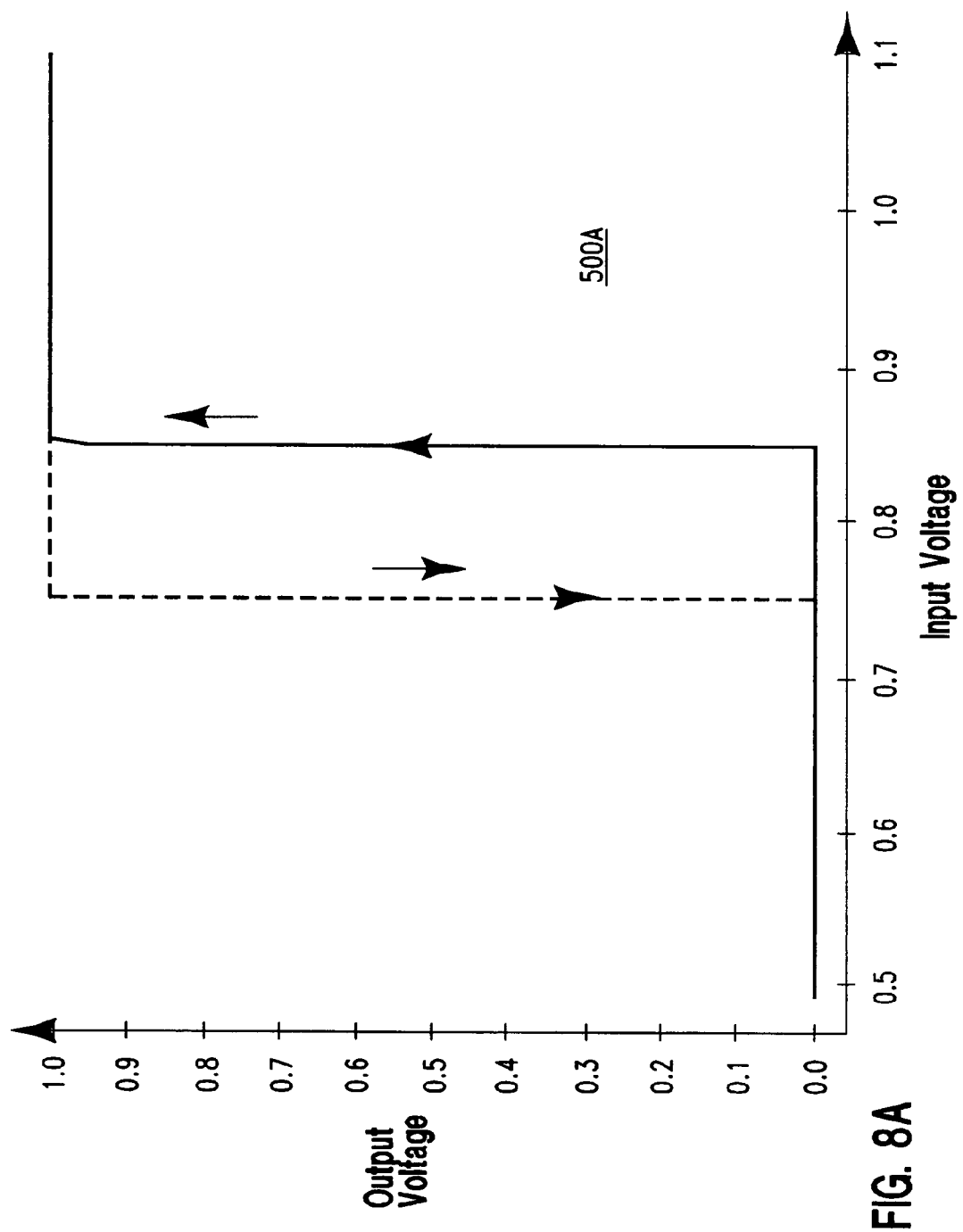
FIG. 8A illustrates operation of the hysteresis comparator shown in FIG. 7 in AC mode testing.
Figure 8B:
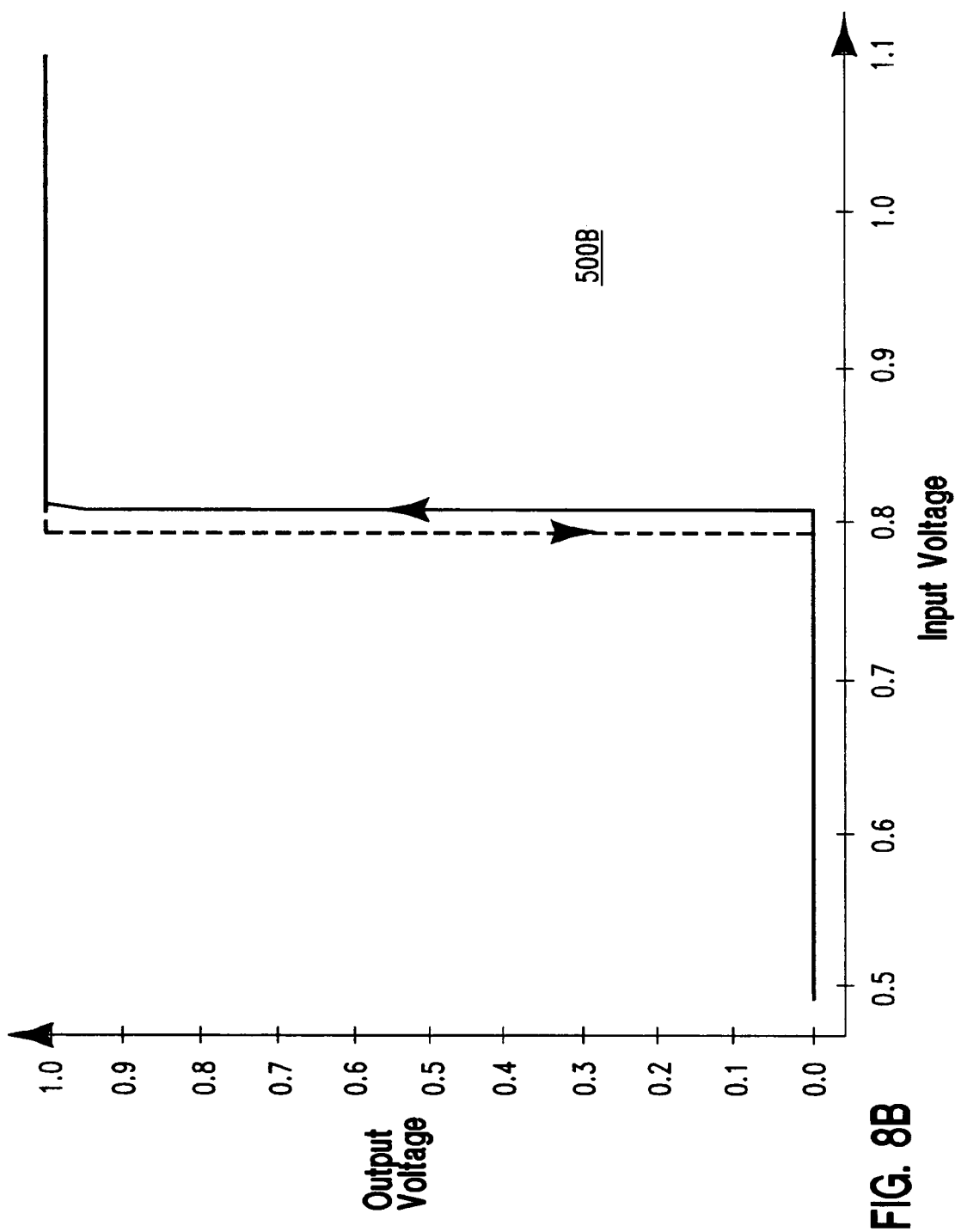
FIG. 8B illustrates operation of the hysteresis comparator shown in FIG. 7 in DC mode testing.

Operation of the hysteresis comparator 400 in AC mode and DC mode is illustrated in FIGS. 8A and 8B, respectively. As shown in FIG. 8A, during AC mode testing, the hysteresis threshold levels are 0.75 V and 0.85 V, respectively. That is, the output of the comparator transitions high when the input signal exceeds 0.85 V, but only transitions low when the input signal falls below 0.75 V. As shown in FIG. 8B, during DC mode testing, the hysteresis threshold levels are 0.795 V and 0.805 V. That is, the output signal transitions high when the input signal exceeds 0.805 V, and transitions low when the input signal falls below 0.795 V.

Figure 9A:
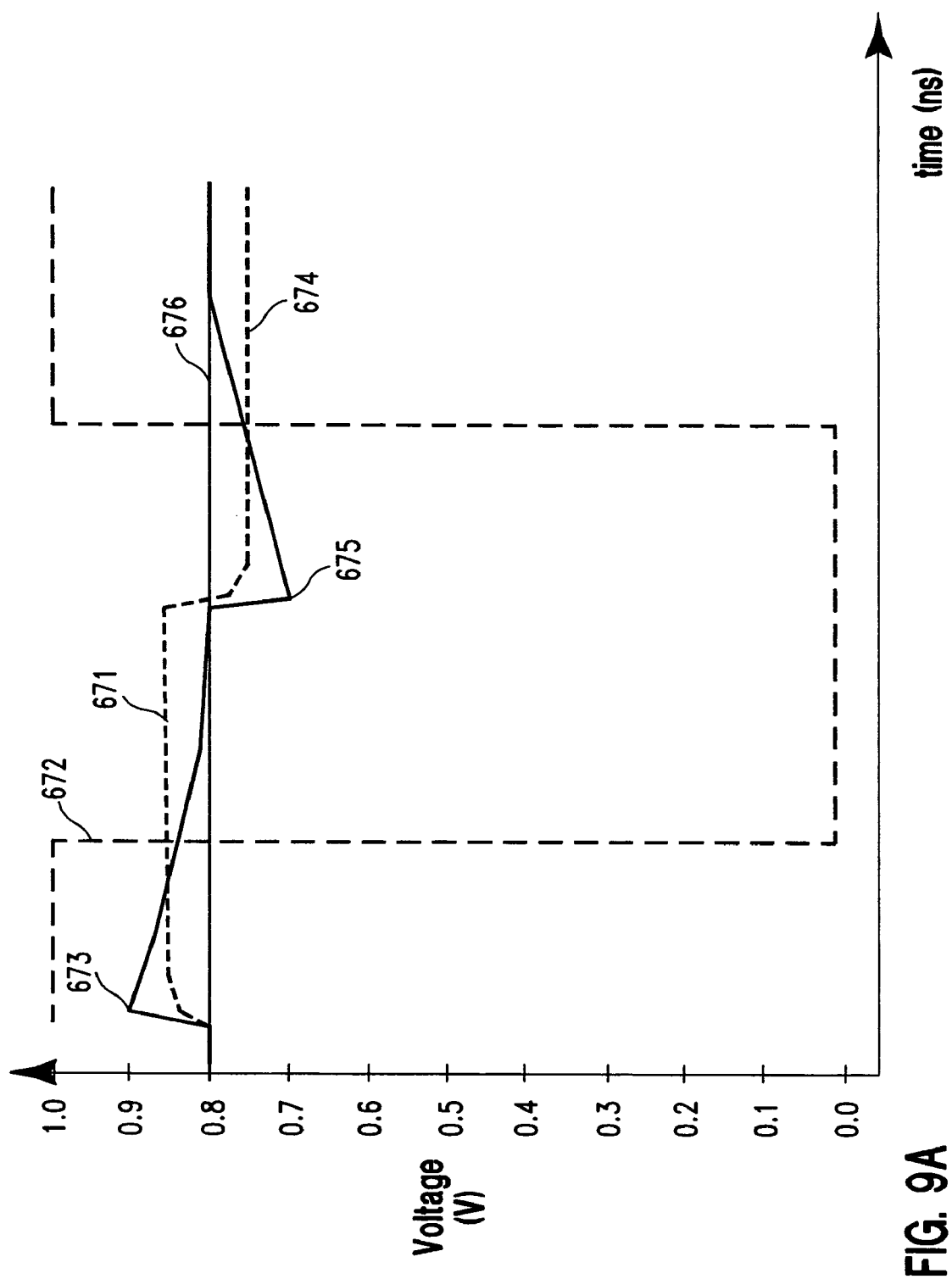
FIG. 9A illustrates the results of performing a DC mode test on a cable having a good AC coupling capacitor.

FIG. 9A illustrates the results of performing a DC mode test on cables having AC coupling capacitors. During such test, a fixed upper threshold 671 and a fixed lower threshold 674 are available to the comparator such as comparator 400 (FIG. 7). For the waveforms shown in FIG. 9A, the coupling capacitor is not shorted. Reading the graph from the left to right, a high input signal 673 initially rises above the threshold 671, at which time output 672 is high. The high input signal 673 then decays towards its common mode level 676. When the input signal 673 falls below the fixed upper threshold 671, the output 672 of the comparator transitions from high to low. Because of the decay of the signal in an AC coupled arrangement, this can be considered a "premature" transition of the signal, in that the comparator output 672 transitions prior to the input signal 673 completing its transition to the common mode level 676. Similarly, a low input signal 675 also decays to the common mode level 676, when the AC coupling capacitor is not shorted. When the low input signal 675 decays to the fixed lower threshold, the comparator output 672 then finally transitions from low to high.

Figure 9B:
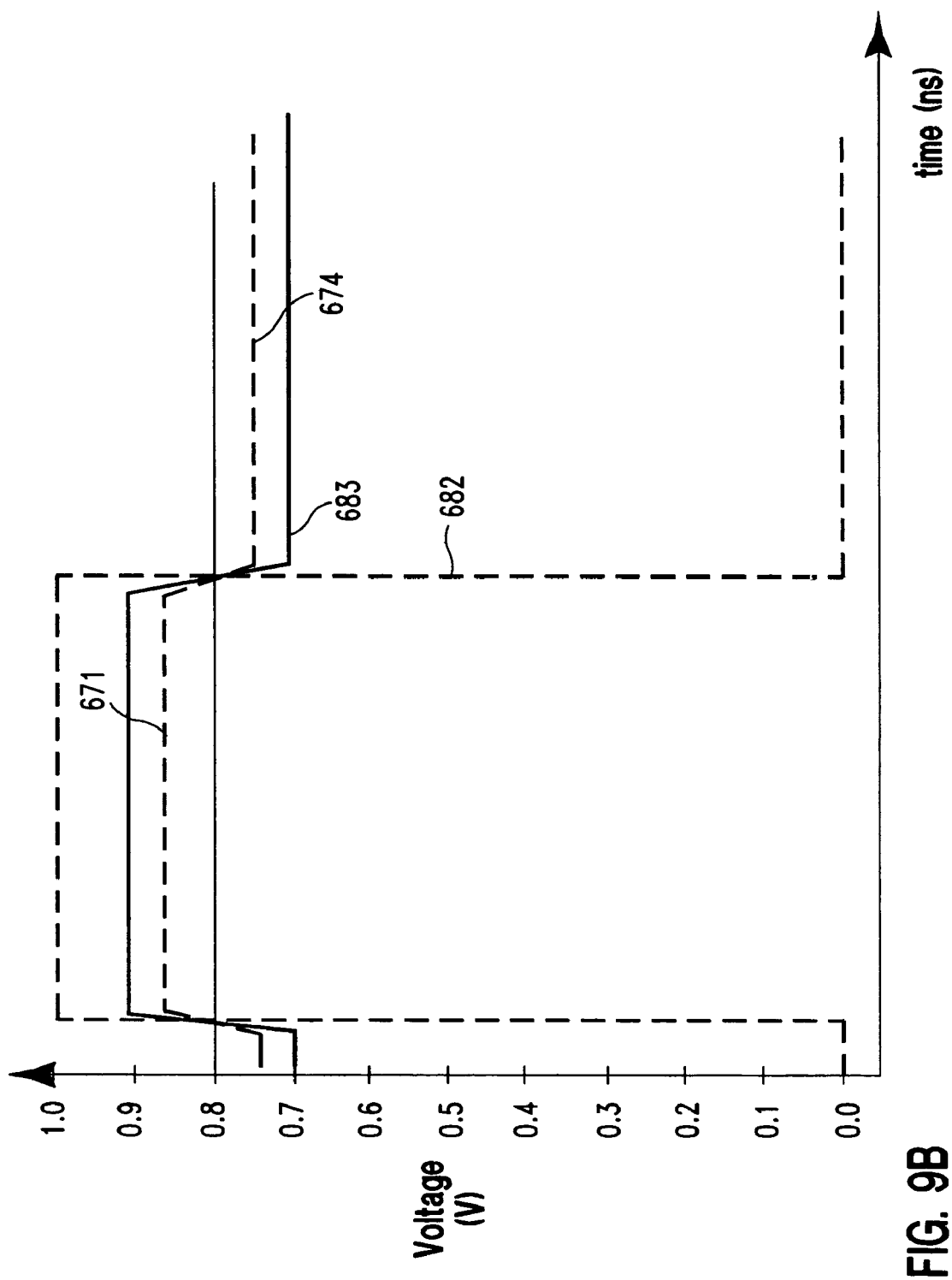
FIG. 9B illustrates the results of performing a DC mode test on a cable having a short-circuited AC coupling capacitor.

FIG. 9B shows a different situation when the AC coupling capacitor is short-circuited. The upper and lower fixed thresholds 671, 674 are the same as before. In contrast to the normal operation depicted in FIG. 9A, when the coupling capacitor is short-circuited, the input signal does not decay according to the RC constant. Hence, the comparator output 682 only changes state when the input signal 683 swings from high to low, or alternatively from low to high. In such manner, a short-circuited AC coupling capacitor is detected by DC mode testing.

During AC test mode, the DC mode control signal DC_Mode is asserted low. The comparator 285 is then transformed into a hysteresis comparator. The input signal is compared to a threshold level which is provided to the comparator 285 as a self-generated reference level. However, for AC mode testing, no premature swing would be observed. AC test mode should successfully detect cable signal even at a situation where RC decay is significant. In such embodiment 285 where the AC test mode utilizes a low-pass filter to create self-reference the hysteresis comparator is less sensitive to system noise. This is desirable for single-ended cable test where noise cannot be cancelled, such as signals output from differential signal devices, e.g., the receiver and signal detector.

Figure 10A:
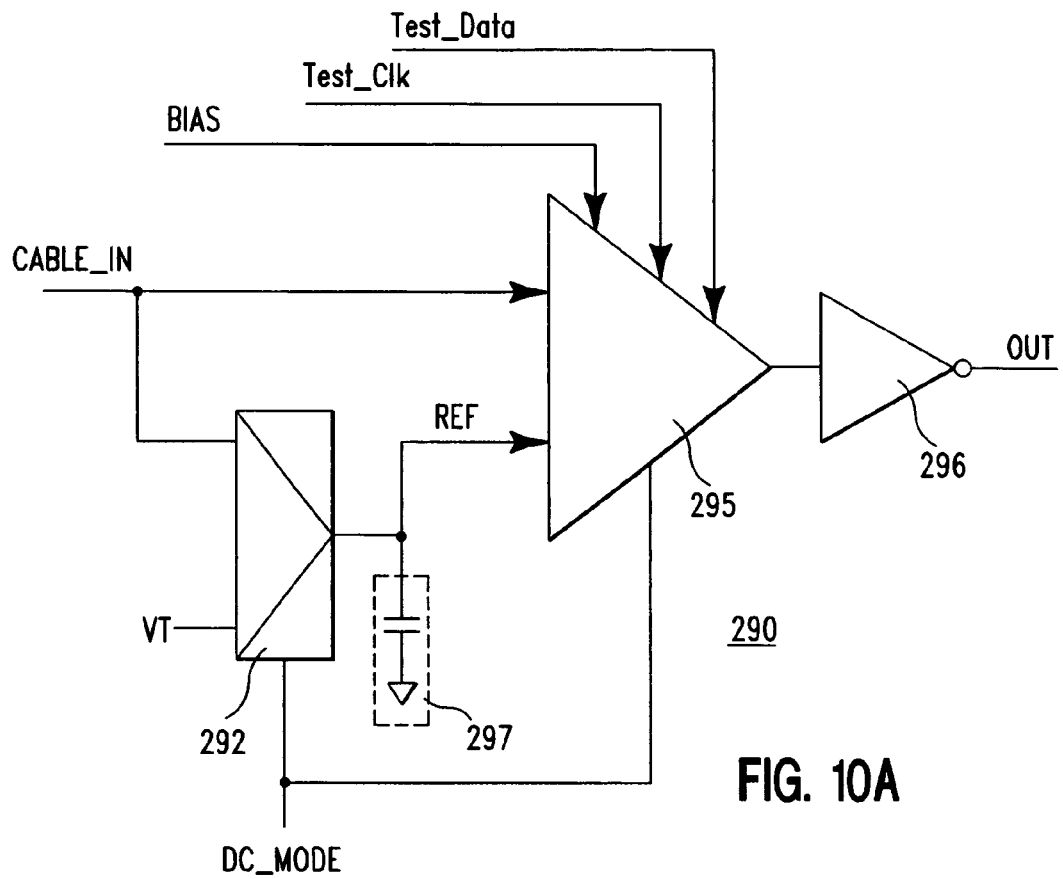
FIGS. 10A and 10B schematically illustrate a cable fault detector according to another embodiment of the invention.

FIG. 10A is a schematic diagram illustrating a cable fault detector 290 according to a second embodiment of the invention. This embodiment differs from that shown in FIG. 5 in that the multiplexer 292 has a high threshold voltage ($V_T$) PFET incorporated therein, in place of resistor 283 which is provided separately in the cable fault detector 200 (FIG. 5). The high $V_T$ PFET has limited transconductance at its biasing point, making it behave like a high value resistor. Such multiplexer 292 achieves a smaller size by eliminating the separate external resistor 283. In addition, the size of the capacitor 297 is also shrunk, to a point needed only for stabilizing the reference level (REF) at the input to the comparator 295. The following illustrates the reduction in area achieved through use of such high $V_T$ PFET. For a cable fault detector 200 having a 3K ohm resistor, the physical size is about 22 μm×3 μm, and for a 1 pF capacitor the size is about 22 μm×5.5 μm. In this case, the resistor is replaced by a low transconductance PFET having a length of 0.5 μm and width of 1 μm. Another modification is the use of a fixed threshold level "VT" for the DC test mode. The VT threshold level is simply the DC common mode level which is available in the receiver. By using a constant reference level, the comparator 295 must be operated with hysteresis for both DC mode and AC mode testing. When the input signal transitions to a level higher than VT plus an additional voltage determined by the hysteresis of the comparator, the output (OUT) of the comparator 295 transitions to high. On the other hand, when the input signal transitions to a level lower than VT minus a voltage determined by the hysteresis, the output (OUT) of the comparator 295 transitions to low.

The comparator 295 is set to different degrees of hysteresis for AC and DC coupling modes, since the signal swing of the input signal is quite different in each case. For the AC case, the input signal has a full peak-to-peak signal swing in relation to its common mode level. For the DC case, the input signal swings by only half of the peak-to-peak signal swing of the AC case. The DC_MODE control is used to adjust the degree of hysteresis of the comparator 295. In the AC mode, the degree of hysteresis is set higher than it is for the DC mode.

Figure 10B:
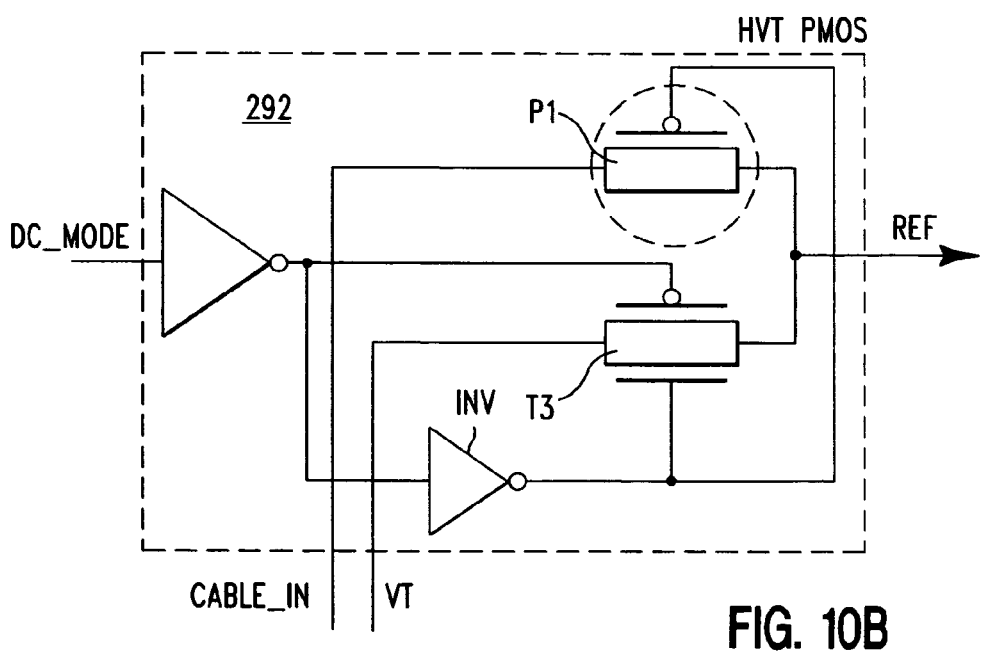

FIG. 10B is a circuit diagram for the multiplexer 292. Here the control signal "DC_MODE" determines whether the threshold level "VT" or "CABLE_IN" is selected by the MUX. As discussed above, in DC mode testing, the fixed threshold level VT (the DC common mode level) is selected as the reference level. In AC mode testing, a self-reference is created by passing the input signal CABLE_IN through a limited transconductance (resistive) PFET P1. A small size PFET is preferably provided, such as achieved through use of a high threshold voltage ($V_T$) and thick gate oxide PFET. As illustrated in FIG. 10A, the output REF of the multiplexer 292 is tied to a small capacitor 297 having a capacitance of about 300 fF. Through use of the PFET in place of a resistor, as in the first embodiment, and use of a smaller size capacitor 297, the overall circuit area occupied by PFET P1 and capacitor 297 of the cable fault detector 290 is reduced by about 40% compared to that of resistor 283 and capacitor 284 of the cable fault detector 200.

Figure 11:
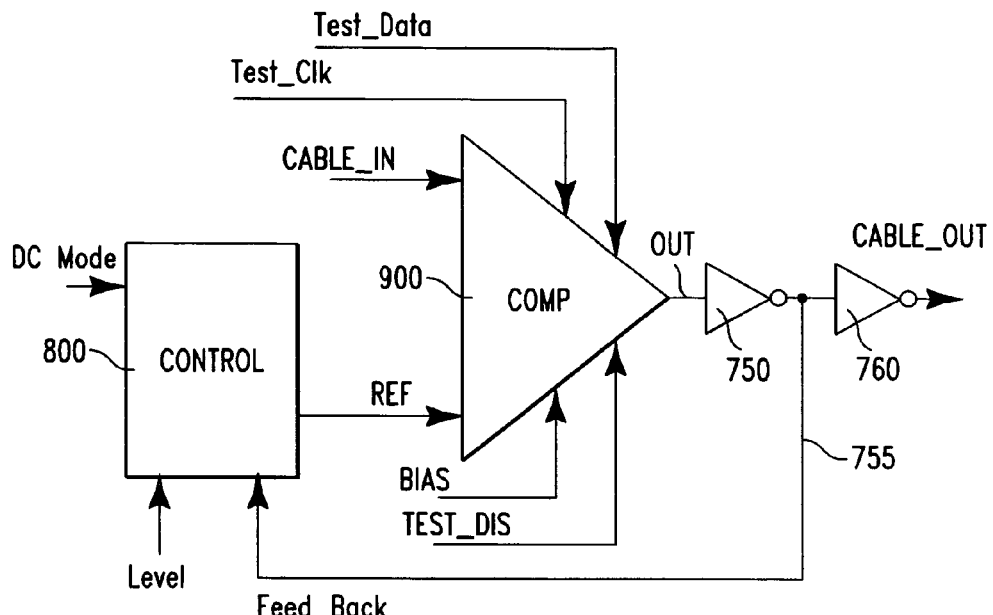
FIG. 11 provides a block and schematic diagram of a cable fault detector according to yet another embodiment of the invention.

A third embodiment of a cable fault detector will now be described, with reference to FIG. 11. In this embodiment, only a simple comparator 900 is used to detect cable faults. Feedback is provided via an external feedback loop 755 from an inverter 750 coupled to the output of the comparator 900. Hysteresis is provided during AC test mode via the external feedback loop, which is only active during AC test mode. A reference level (REF) to the comparator 900 is provided from a control block 800 for both AC and DC test modes. A control signal "DC Mode" determines whether testing is conducted in the DC mode or the AC mode. The DC Mode signal, when enabled, deactivates the feedback loop for DC mode testing. Conversely, when the DC Mode signal is disabled, the feedback loop is activated for AC mode testing.

As discussed above, the output of the comparator 900 is inverted by inverter 750. The output of the inverter 750 is coupled to a second inverter 760 which produces a signal CABLE_OUT which digitally regenerates the output of the comparator 900. The thus regenerated comparator output CABLE_OUT is then provided to a sample latch (not shown) for output to additional circuitry.

In operation, the comparator 900 compares the input signal from the cable (CABLE_IN) to the reference level (REF). When the input signal level CABLE_IN is higher than the reference level REF, the output of the comparator transitions to high. The feedback signal 755 to the control circuit 800 then causes the reference level REF to transition to the low AC mode level. As a result, the output of the comparator 900 remains at the high level so long as the input signal level remains above the low AC mode level. In such way, the hysteresis operation of the comparator 900 is provided. Thereafter, when the input signal level falls lower than the low AC mode reference level, the comparator output then transitions to low.

When testing in the AC test mode, the reference level REF is initially set to high. When the incoming signal rises above the high AC mode reference level, the output of the comparator 900, and CABLE_OUT from the second inverter 760 goes high. In turn, the feedback signal 755 output from the inverter 750 goes low. As a result of the low feedback signal, the control circuit 800 switches the reference level REF input to the comparator 900 from high to low. After REF has been switched to the low level, the output of the comparator 900 now remains high for such time as the input signal finally falls below the low REF level. In such manner, signals received from transmission links that are AC coupled and which have an RC decay will not cause the comparator output to change state prematurely by this arrangement.

Figure 12A:
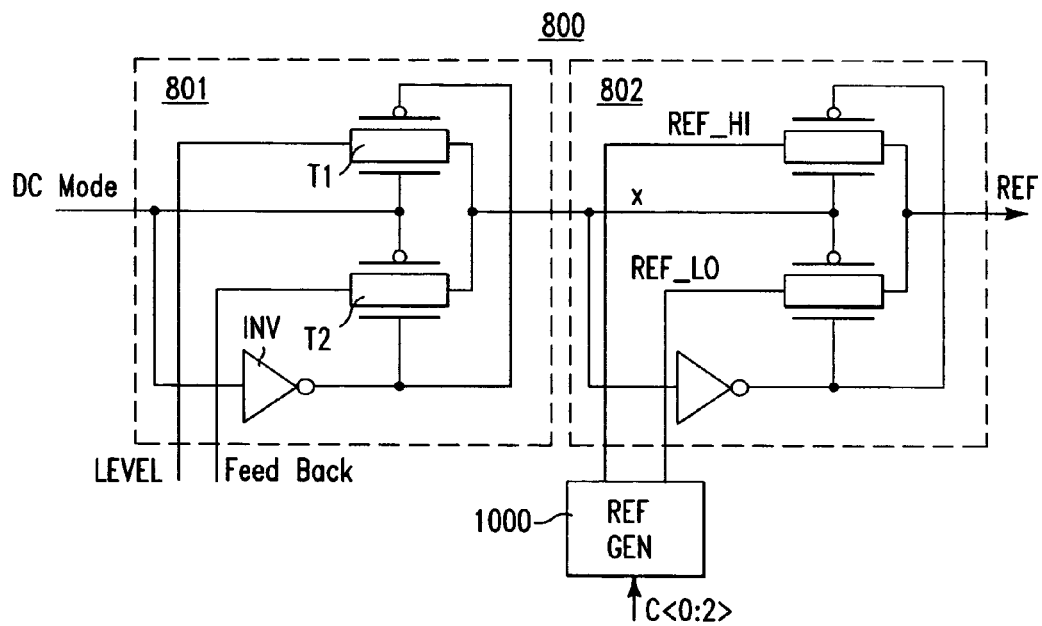
FIG. 12A is a circuit level diagram illustrating a control block utilized in the cable fault detector shown in FIG. 11.

A circuit schematic of control block 800 is illustrated in FIG. 12A. Control block 800 includes two multiplexers 801 and 802 and a reference generator 1000. The first multi-plexer 801 illustratively includes a pair of double-gated PFETs T1 and T2, each of which operates as a transmission gate. The first PFET T1 is switched on and off by the DC Mode control signal and its inverse, respectively, and passes the DC reference level LEVEL via node X to the second multiplexer 802 when it is switched on. The second PFET T2 is switched off and on by the DC Mode control signal and its inverse, respectively, and passes the Feedback signal via node X to the second multiplexer 802 when the DC Mode control signal is inactive, causing it to be switched on.

For both DC and AC testing modes, the reference generator creates a high reference level REF_HI to detect a positive incoming signal, and a low reference level REF_LO to detect a negative incoming signal. Details of the reference generator will be further described later. The feedback logic is used during AC test mode, and the LEVEL logic is for DC test mode to choose either REF_HI or REF_LO to be sent through the second transmission gate 802 for setting reference level (REF). Binary bits C <0:2> are used to fine tune the reference levels. With the three control bits thus provided by the reference generator 1000, reference levels each having up to eight different values can be provided from the reference generator 1000.

Figure 12B:
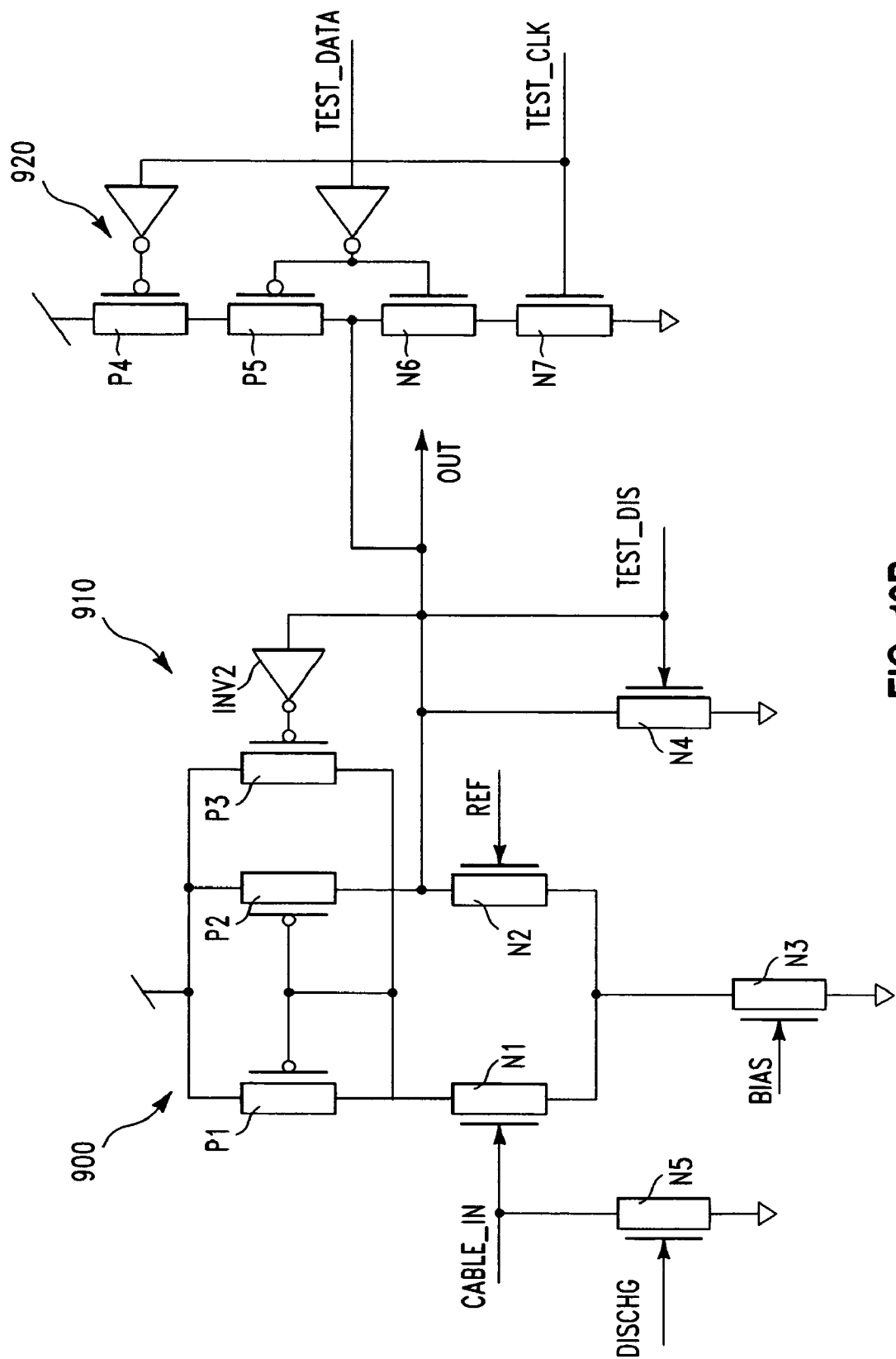
FIG. 12B is a circuit level diagram illustrating a comparator and related circuitry utilized in the cable fault detector shown in FIG. 11.

FIG. 12B is a detailed illustration providing a circuit level diagram of comparator 900 and related circuit components. In addition to comparator 900, FIG. 12B illustates a cable discharge device (N15), a test disable device 910 formed by devices P3, INV2 and N4, and an initial data loading device 920, formed by the combination of devices P4, P5, N6, N7 and two inverters.

The basic operation of the comparator 900 has already been discussed above. The bias input to NFET N3 helps determine the frequency response of the comparator. The DISCHG input to NFET N5 resets the input signal CABLE_IN to the comparator 900, thus disabling the output signal CABLE_OUT. For AC mode test, it is necessary to set the reference level REF to a known state before testing. The initial data loading device 920 performs such function. TEST DATA sets the initial state of CABLE_OUT to high, when enabled by TEST_CLK. In turn, as discussed above with reference to FIG. 11, the reference input REF to the comparator is set to REF_LO in response to feedback from the high output of the comparator. When testing is completed, the TEST_DATA signal goes low, which then causes the state of CABLE_OUT to go low. The cable fault detectors shown and described above with respect to FIGS. 5A and 10A optionally include such initial data loading device to initialize the output of the comparator to an initial condition in relation to movement of the signal. Such initialization permits the cable fault detectors to more quickly identify short-circuited capacitor faults in DC mode testing.

For DC mode testing, comparator 900 operates without hysteresis. For such testing, there is no need for the initial data loading device 920 to reset the state of the comparator 900. TEST_CLK is reset to low to place the initial data loading device 920 in a high impedance state. Under such condition, the TEST_DATA signal floats is set to either high or low, as it does not affect the state of CABLE_OUT then.

Figure 13:
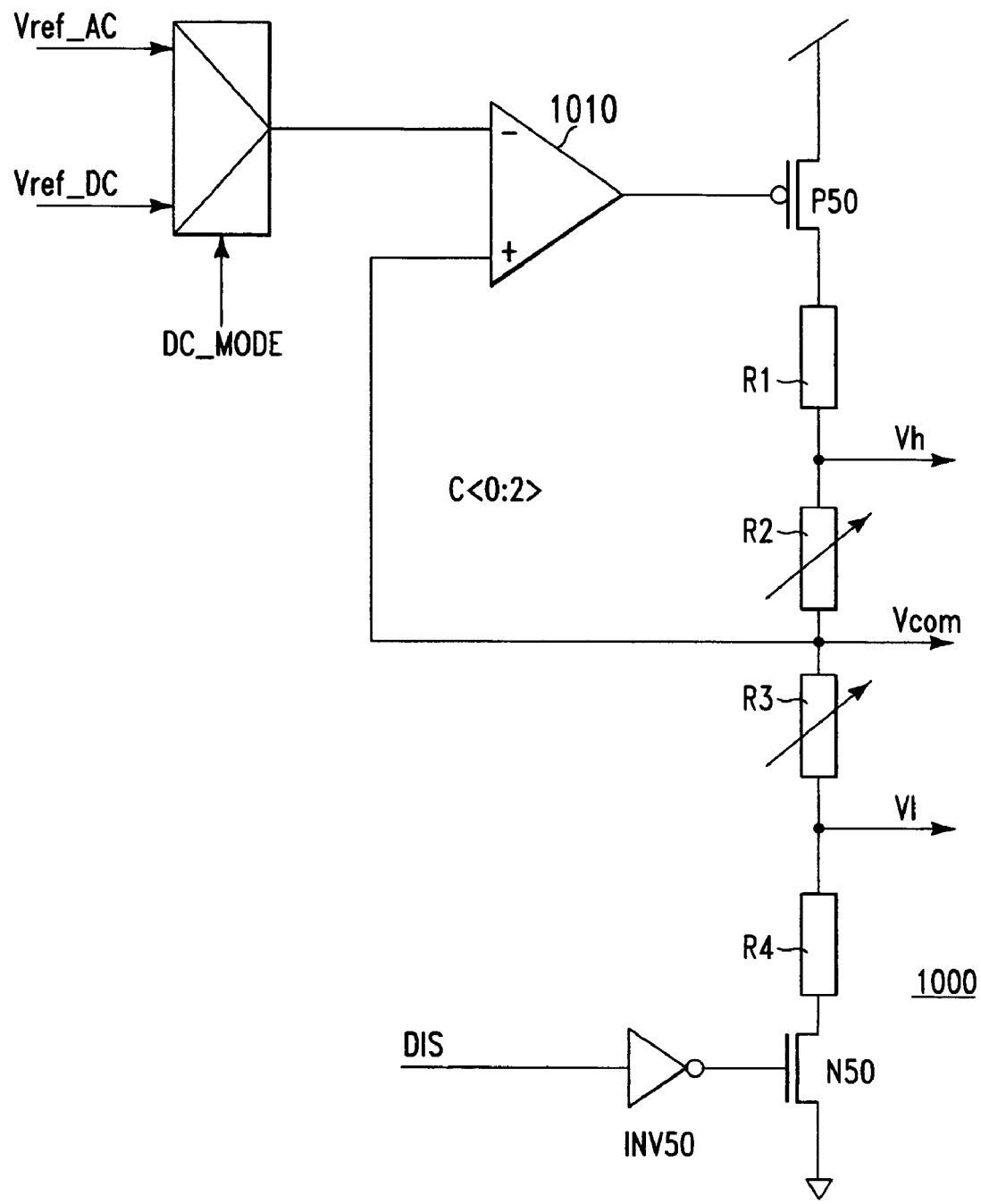
FIG. 13 is a circuit level diagram illustrating a reference level generator utilized in the cable fault detector shown in FIG. 11.

The reference generator 1000, illustrated in FIG. 13, generates reference levels for both DC and AC mode testing, providing that there is a common mode offset between them. For AC mode testing, a "Vref_AC" level is used to set the AC common mode level. For DC mode testing, a "Vref_DC" level is used to set DC common mode level. A differential amplifier 1010 is used to regulate the generated common mode levels. From the common mode levels, a positive reference level "Vh" and a negative reference level "Vl" are generated. Adjustable resistive elements R2 and R3 are used to fine tune these reference levels. Tuning resistive elements is a well-known technique and will not be described further. The advantage of using separated reference levels for AC and DC couplings is to avoid requiring use of a self-reference. The self-reference scheme requires large capacitance and large resistance to create a RC delay component. The size of the capacitor is almost as large as the whole test receiver circuit. In the some receiver designs, both AC and DC common mode levels are generated by other circuitry and are available and easily accessible.

The operation of comparator 900 in AC mode testing of AC coupled transmission links is illustrated in FIGS. 14A-14B. FIG. 14A illustrates the waveform 1101 of the input signal CABLE_IN to the comparator 900 in relation to time. FIG. 14B illustrates the waveform 1106 of the output CABLE_OUT in relation to time. Both waveforms are shown for the condition in which the cable is not faulty, having a good AC coupling capacitor. As illustrated in FIG. 14A, the positive swing incoming signal 1101 coupled through a good capacitor exhibits RC decay with time. The threshold level 1105 that is input to the comparator as a reference level is initially preset to high (Vh) 1102. When CABLE 1101 exceeds the threshold Vh 1102 then in place to trigger the comparator, as shown by the rising transition of CABLE_OUT in FIG. 14B, the feedback causes the threshold level to change from high (Vh) at 1102 to low (Vl) at 1104. Thereafter, the input signal CABLE_IN is permitted to decay to the common mode level 1103. Then, CABLE_IN changes state to low, at which time it crosses the low threshold level (Vl) 1104, and causes the CABLE_OUT signal 1106 to change its state to low again. At such time 1105, the feedback to the control circuit then causes the threshold level to change from low (Vl) 1104 to high (Vh) 1102 again and the cycle begins again.

As described above with reference to FIGS. 9A and 9B, the DC mode test is used to determine faults involving a short-circuited capacitor. For DC mode testing according to the present embodiment of the invention, waveforms for good and bad AC coupled cables during DC mode testing are as those shown and described above relative to FIGS. 9A and 9B.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A system for detecting a fault in a transmission link, comprising: a reference level generator to output a reference level selectable according to one of a direct current (DC) mode threshold and an alternating current (AC) mode threshold, wherein the DC mode threshold is a fixed potential and the AC mode threshold varies with time; and a comparator to detect the crossing of the reference level by an input signal arriving from the transmission link, the comparator having a degree of hysteresis selectable in response to a second signal input to the comparator other than the input signal arriving from the transmission link.

2. A system as claimed in claim 1, wherein the AC mode threshold varies as a version of the input signal decaying with time.

3. A system as claimed in claim 1, wherein said reference level generator can be operated to selectably switch between outputting a lower threshold and an upper threshold as the DC mode threshold, wherein said comparator can be operated to detect a crossing of the upper threshold and to detect a crossing of the lower threshold.

4. A system as claimed in claim 3, wherein said comparator can be operated to detect a falling crossing of the lower threshold and detect a rising crossing of the upper threshold.

5. A system as claimed in claim 4, wherein said reference level generator further comprises a multiplexer and said multiplexer can be operated to select between outputting the DC mode threshold and the AC mode threshold.

6. A system as claimed in claim 1, wherein said reference level generator includes a low-pass filter coupled to the input signal, wherein said low-pass filter can be used to generate the AC mode threshold from the input signal.

7. A system as claimed in claim 6, wherein said low-pass filter includes a series resistor coupled between the input signal and said comparator and a shunt capacitor coupled between the reference level and a fixed potential.

8. A system as claimed in claim 7, wherein said low-pass filter includes a field effect transistor (FET) having a drain to which the input signal is coupled, said FET having a controlled transconductance.

9. A system as claimed in claim 1, wherein said system can be operated to detect a short-circuited capacitor in an AC coupled transmission link when said comparator fails to detect a crossing of the DC mode threshold by the input signal.

10. A system as claimed in claim 1, wherein said reference level generator can be operated to output a first level of the AC mode threshold, wherein said comparator can be operated to detect a falling crossing of the first level and said reference level generator can be operated to output a second level of the AC mode threshold higher than the first level, wherein said comparator can be operated to detect a rising crossing of the second level.

11. A system as claimed in claim 10, wherein the separation between the first level and the second level is adjustable according to a setting of said comparator.

12. A system as claimed in claim 10 wherein said reference level generator can be operated to vary the reference level between the first level and the second level in response to feedback from said comparator.

13. A system as claimed in claim 12, wherein the reference level is set to the first level when said comparator detects a rising crossing of the reference level, and the reference level is set to the second level when said comparator detects a falling crossing of the reference level.

14. A system as claimed in claim 1, wherein said comparator can be operated to detect a falling crossing of the reference level when the input signal reaches a first value and can be operated to detect a rising crossing of the reference level when the input signal reaches a second value, wherein the separation between the first value and the second value is adjustable according to a setting of said comparator.

15. A system as claimed in claim 1, wherein said reference level generator can be operated to maintain the DC mode threshold at a substantially constant level, wherein said comparator can be operated to detect a falling crossing of the DC mode threshold and to detect a rising crossing of the DC mode threshold at substantially the same level of the input signal.

16. The system as claimed in claim 1, wherein the comparator has a first degree of hysteresis during a DC mode when the system is DC coupled to the transmission link and has a second degree of hysteresis greater than the first degree during an AC mode when the system is AC coupled to the transmission link.

17. The system as claimed in claim 1, wherein the second signal is represented by multiple digital bits, the system further comprising a digital-to-analog converter which can be operated to convert the second signal to an analog second signal having multiple different levels and the comparator can be operated with different degrees of hysteresis in accordance with the multiple different levels of the analog second signal.

18. A method of detecting a fault in a transmission link, comprising: providing a reference level selectable according to one of a direct current (DC) mode threshold and an alternating current (AC) mode threshold, wherein the DC mode threshold is a fixed potential and the AC mode threshold varies with time; and comparing an input signal arriving from the transmission link with one of the DC mode threshold and the AC mode threshold to determine whether a fault is present in the transmission link, said comparing being performed with different degrees of hysteresis depending upon a value of a second signal.

19. A method as claimed in claim 18, wherein the AC mode threshold varies as a version of the input signal decaying with time.

20. A method as claimed in claim 19, wherein, when the input signal is compared to the DC mode threshold, the input signal is compared to each of a lower threshold and an upper threshold as the DC mode threshold.

21. A method as claimed in claim 18, wherein the AC mode threshold is generated by low-pass filtering the input signal.

22. A method as claimed in claim 18 further comprising detecting a short-circuited capacitor in an AC coupled transmission link when said comparing fails to detect a crossing of the DC mode threshold by the input signal.

23. A method as claimed in claim 18, wherein the AC mode threshold is switched between a first level and a second level higher than the first level, wherein said comparing detects a falling crossing of the first level and said comparing detects a rising crossing of the second level.

24. A method as claimed in claim 23, wherein the separation between the first level and the second level is adjustable.

25. The method as claimed in claim 18, when said comparing is performed with a greater degree of hysteresis in an AC testing mode when the input signal is AC coupled to the transmission link than when the input signal is DC coupled to the transmission link.

* * * * *